(12) United States Patent
Oesterheld et al.

(10) Patent No.: US 8,593,298 B2
(45) Date of Patent: Nov. 26, 2013

(54) SURFACE MOUNT CIRCUIT BOARD INDICATOR

(75) Inventors: Klaus Oesterheld, Freehold, NJ (US); Kenneth Jenkins, Port Monmouth, NJ (US)

(73) Assignee: Dialight Corporation, Farmingdale, NJ (US)

( * ) Notice: Subject to any disclaimer, the term of this patent is extended or adjusted under 35 U.S.C. 154(b) by 445 days.

(21) Appl. No.: 12/435,090

(22) Filed: May 4, 2009

(65) Prior Publication Data
US 2009/0273939 A1 Nov. 5, 2009

Related U.S. Application Data

(60) Provisional application No. 61/050,452, filed on May 5, 2008.

(51) Int. Cl.
*G08B 5/22* (2006.01)

(52) U.S. Cl.
USPC ....... 340/815.45; 362/555; 362/581; 362/800

(58) Field of Classification Search
USPC ............. 340/815.45; 362/555, 581, 800, 646; 257/98, E33.067; 345/30, 33; 439/377, 439/541.5
See application file for complete search history.

(56) References Cited

U.S. PATENT DOCUMENTS

| | | | |
|---|---|---|---|
| 4,194,815 A | 3/1980 | Trombley | |
| 4,959,761 A * | 9/1990 | Critelli et al. | 362/646 |
| 5,349,504 A | 9/1994 | Simms et al. | |
| 6,590,235 B2 | 7/2003 | Carey et al. | |
| 6,804,062 B2 | 10/2004 | Atwater et al. | |
| 7,062,112 B2 * | 6/2006 | Simms | 385/14 |
| 7,066,660 B2 | 6/2006 | Ellison | |
| 7,289,836 B2 | 10/2007 | Colvin, Jr. | |
| 7,329,034 B2 * | 2/2008 | Verdes et al. | 362/555 |
| 2001/0022564 A1 * | 9/2001 | Youngquist et al. | 345/55 |
| 2004/0174716 A1 | 9/2004 | Verdes et al. | |
| 2005/0179547 A1 * | 8/2005 | Maloney | 340/568.1 |
| 2005/0264472 A1 | 12/2005 | Rast | |
| 2006/0049423 A1 | 3/2006 | Yamaguchi et al. | |

(Continued)

FOREIGN PATENT DOCUMENTS

| | | |
|---|---|---|
| JP | H4-225389 A | 8/1992 |
| JP | H5-66718 A | 3/1993 |

(Continued)

OTHER PUBLICATIONS

International Search Report and Written Opinion for PCT/US2009/042732; Jun. 30, 2009, copy consists of 8 pages.

(Continued)

*Primary Examiner* — Steven Lim
*Assistant Examiner* — Hongmin Fan

(57) ABSTRACT

The present invention is directed to a surface mount circuit board indicator. In one embodiment the surface mount circuit board indicator includes a printed circuit board (PCB) having at least one light emitting diode (LED) die, one or more traces and at least one lens, a housing comprising at least one opening on a side along a perimeter of the housing, wherein the PCB is coupled to the housing such that a light output surface of the at least one LED die faces a same direction as the at least one opening and at least one alignment pin coupled to the housing.

18 Claims, 5 Drawing Sheets

(56) References Cited

U.S. PATENT DOCUMENTS

2006/0102914 A1     5/2006     Smits et al.
2008/0242190 A1*   10/2008    Hofer et al. .................. 446/220
2009/0045424 A1     2/2009     Liskoff

FOREIGN PATENT DOCUMENTS

| | | |
|---|---|---|
| JP | H9-95175 A | 4/1997 |
| JP | 2006-324529 A | 11/2006 |
| WO | WO 2007/015606 | 2/2007 |

OTHER PUBLICATIONS

International Search Report for PCT/US2008/072713, Oct. 22, 2008, copy consists of 3 pages.
Robert G. Hunspergof, "Integrated Optics: Theory and Technology", 1984, Springer-Verlag, pp. 26-27.
Office Action for CN 200680102780.3, Feb. 28, 2011, copy consists of 7 pages.
Office Action from CN 2008801012780.3, Oct. 18, 2011, copy consists of 16 pages.
English Translation of Second Office Action for CN 200980116224.6; Jan. 17, 2013, copy consists of 13 pages.
Office Action for CN Appln. No. 200980116224.6, May 9, 2012, copy consists of 2 pages.
Office Action for CA Appln. No. 2,695,958, Aug. 20, 2012, copy consists of 2 pages.
Office Action for CA Appln. No. 2,722,585, Sep. 26, 2012, copy consists of 2 pages.
Office Action for CN Appln. No. 200880102780.3, Nov. 21, 2012, copy consists of 2 pages.
Office Action for CA Appln. No. 2,722,585, Jun. 28, 2013, copy consists of 3 pages.
Office Action for JP Office Action Appln. No. 2011-508580, Jul. 16, 2013, copy consists of 12 pages.

* cited by examiner

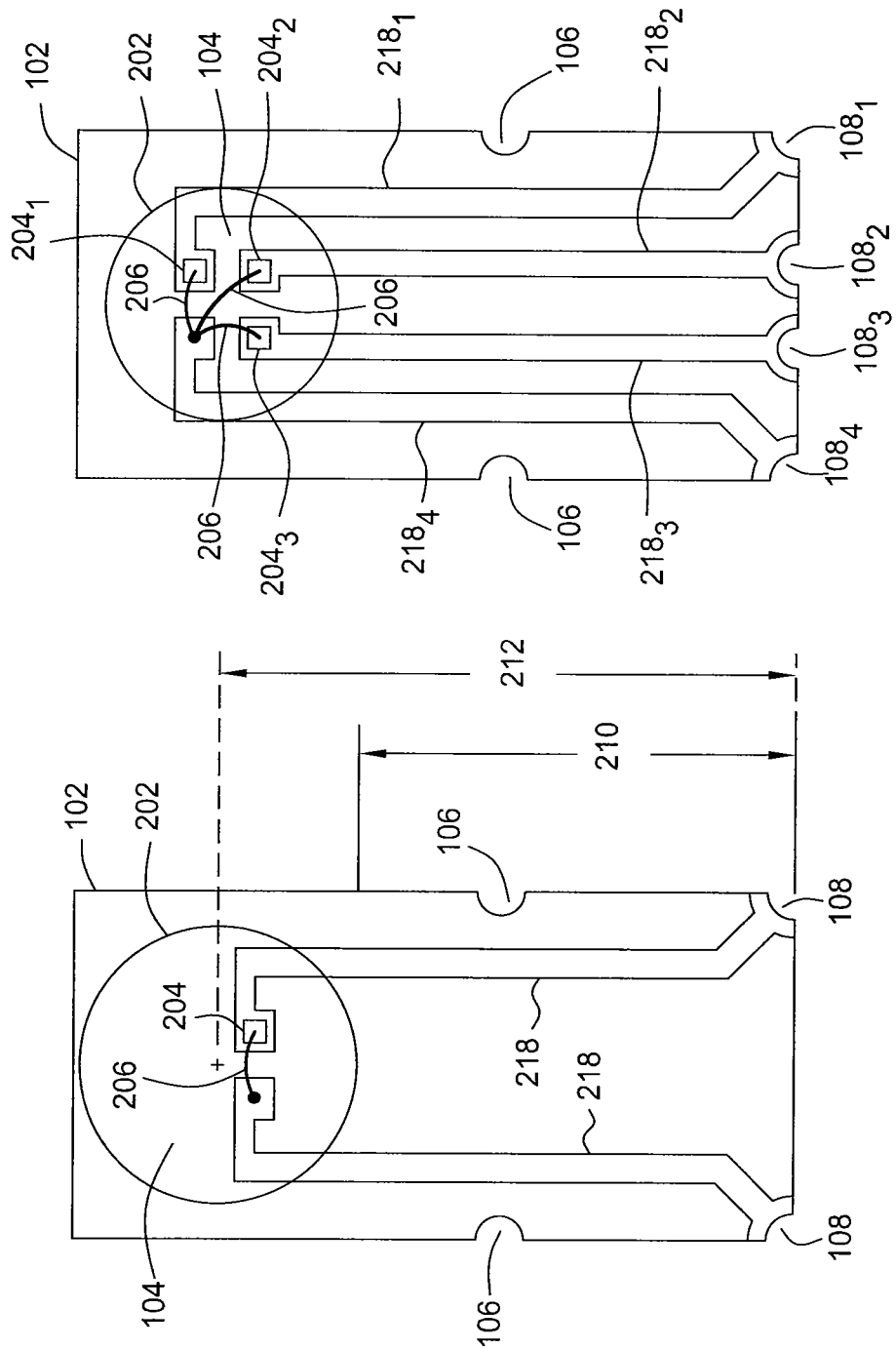

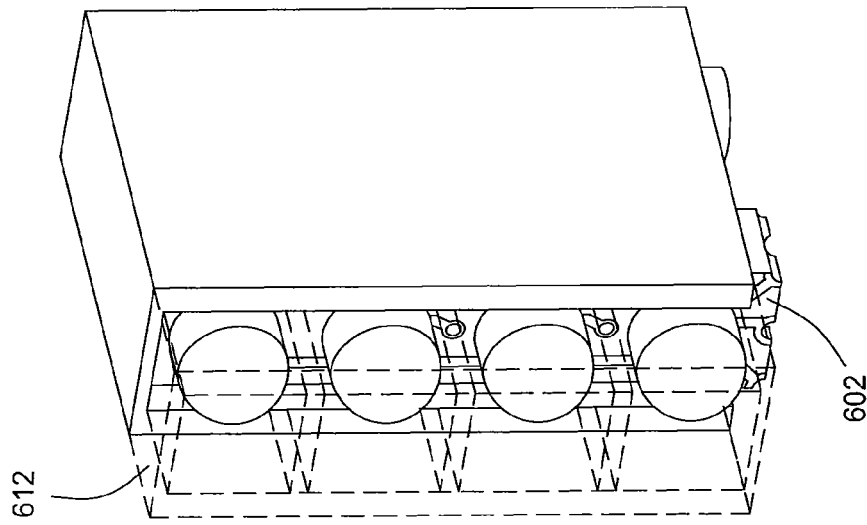
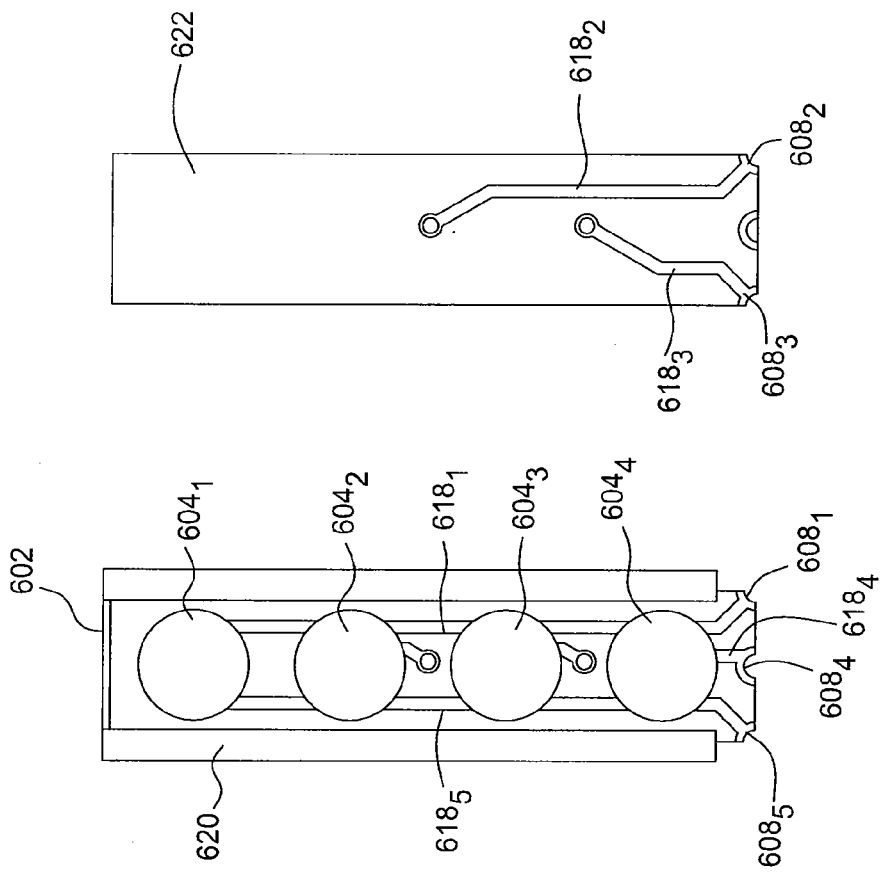

SURFACE MOUNT CIRCUIT BOARD INDICATOR

RELATED APPLICATIONS

This application claims priority under 35 U.S.C. §119(e) to U.S. provisional patent application Ser. No. 61/050,452, filed on May 5, 2008, which is hereby incorporated by reference in its entirety.

FIELD OF THE INVENTION

The present invention is directed to indicator lighting for right angle indication applications and, specifically for surface mount circuit board indicators.

BACKGROUND OF THE INVENTION

Some applications require right angle indication lights. Right angle indication lights are used in any application that has a mother board or main circuit board with all the components 90 degrees or right angle to the front panel, face plate or operator interface. The panel or faceplate has holes, or small windows with matte transparent labels attached for visual status indication of some kind, usually 90 degrees to the main circuit board edge and above or below a distance Y within the context of a three dimensional X-Y-Z space of a surface of the main circuit board. Lighting is usually mounted in these areas of the main circuit board. For example, this is the format in telecom rack equipment, servers, computers, disc drives, and other electronic equipment throughout many Industries such as telecommunications, industrial, medical, and consumer products.

Current available options have many drawbacks. For example, some applications use a thru hole light emitting diode (LED) (an LED with two leads and a dome) that was formed at right angles inside a black LED housing circuit board indicators (CBI) with leads extending enough to mount into two plated thru holes in a mother board or main circuit board. However, the thru hole CBI LEDs often do not survive surface mount reflow processing with temperatures up to 260 degrees Celsius (° C.) on the same side of the mother board or main circuit board as the LED component.

Other options include a right angle prism. The prism uses a prism lens which directs the light out at right angles from a light source. However, in the prism the LED light source, die or chip is a distance away and 90 degrees from the lens output viewing surface. In the prism implementations, the light loss from the LED die or chip to an output surface of the lens can be as high as 50% or more, hence it requires brighter LEDs at the input to obtain a reasonable viewing output. This leads to inefficient lighting, more energy consumption and/or added heat output. Moreover, these disadvantages of the prism are magnified as the required vertical distance for placing the light output above the main circuit board increases.

SUMMARY OF THE INVENTION

The present invention relates generally to a surface mount circuit board indicator. In one embodiment, the surface mount circuit board indicator comprises a printed circuit board (PCB) having at least one light emitting diode (LED) die, one or more traces and at least one lens, a housing comprising at least one opening on a side along a perimeter of said housing, wherein said PCB is coupled to said housing such that a light output surface of said at least one LED die faces a same direction as said at least one opening and at least one alignment pin coupled to said housing.

In one embodiment, the present invention provides a printed circuit board. The printed circuit board comprises a plurality of lenses, wherein each one of said plurality of lenses covers at least one light emitting diode (LED) die coupled to said PCB, at least one trace coupled to each one of said at least one LED die, at least one locking slot and a vertical extension member.

In one embodiment, the present invention provides a main circuit board for receiving a surface mount circuit board indicator. In one embodiment, the main circuit board for receiving a surface mount circuit board indicator comprises at least one alignment solder pad for receiving at least one alignment pin of said surface mount circuit board indicator and at least one conductive solder pad for receiving at least one pad location coupled to a trace coupled to at least one light emitting diode (LED) die of a printed circuit board (PCB), wherein said at least one LED die is covered by a respective lens and said PCB is vertically inserted into a housing such that said at least one LED die of said PCB emits a light in a same direction as at least one opening on a side along a perimeter of said housing and said light exits through said at least one opening, wherein said PCB is adjacent to said at least one opening.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6 depicts an illustrative front view of a printed circuit board having a single light emitting diode (LED) die;

FIG. 7 depicts an illustrative front view of a printed circuit board having a plurality of LED dice;

FIG. 11 depicts an illustrative front view of a printed circuit board having a vertically stacked array of LEDs;

FIG. 12 depicts an illustrative back view of the printed circuit board having the vertically stacked array of LEDs; and FIG. 13 depicts an illustrative isometric view of a fully assembled surface mount circuit board indicator having the vertically stacked array of LEDs.

To facilitate understanding, identical reference numerals have been used, where possible, to designate identical elements that are common to the figures.

DETAILED DESCRIPTION

Figure 1:
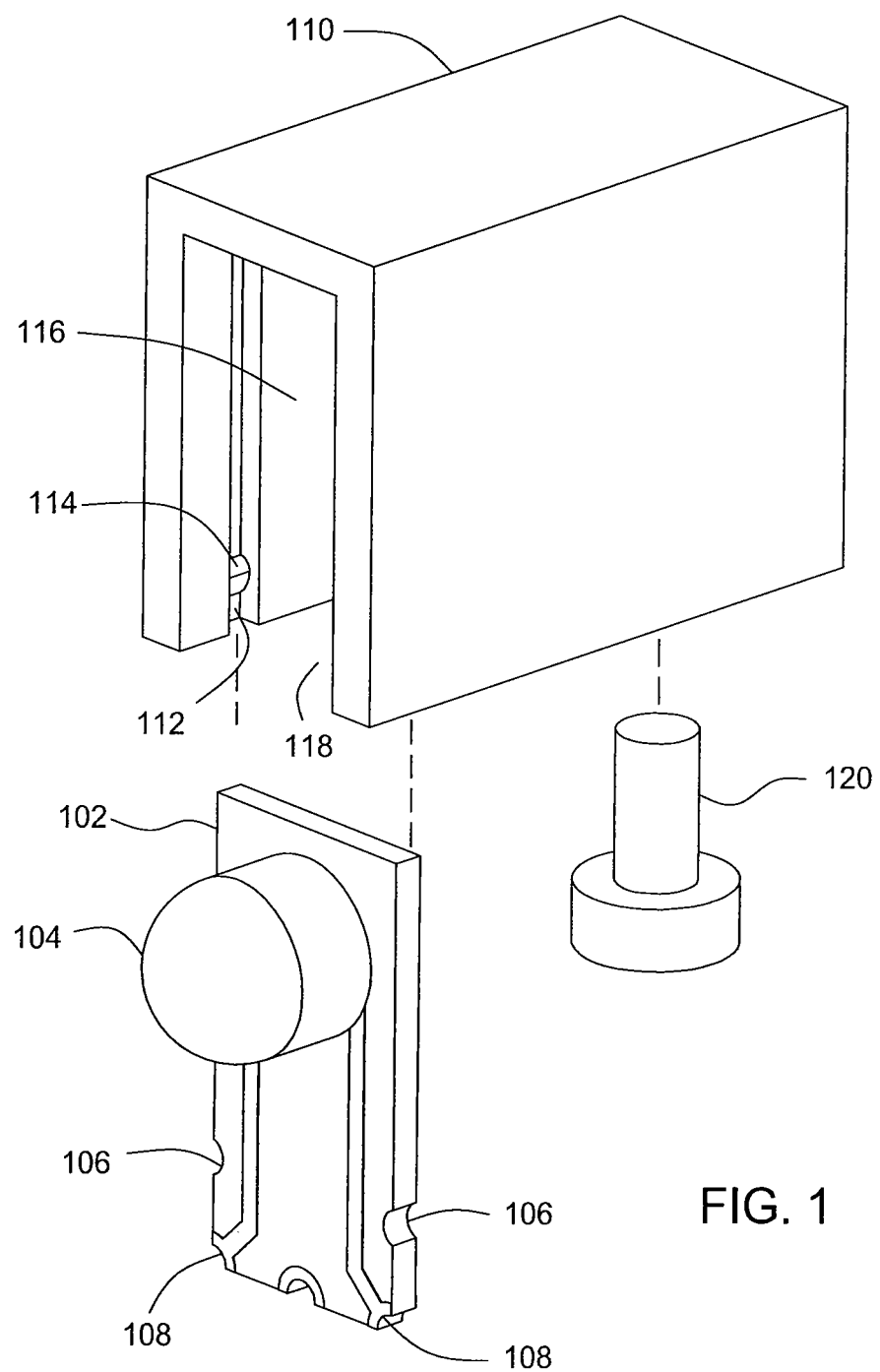
FIG. 1 depicts an illustrative exploded view of a surface mount circuit board indicator.

FIG. 1 depicts an illustrative exploded view of a surface mount circuit board (SMCB) indicator light 100. In one embodiment, the SMCB indicator light 100 comprises a printed circuit board (PCB) 102, a housing 110 and an alignment pin 120.

At least one light emitting diode (LED) 104 may be coupled to the PCB 102. The PCB 102 may also include one or more locking slots 106 and one or more pad locations 108. The pad locations 108 may be a quarter round shape or a half round shape and used as electrical contacts of an LED die (discussed below) of the LED 104 to a main circuit board that the SMCB indicator light 100 is mounted on. In one embodiment, the one or more pad locations 108 are conductive and located along an edge of the PCB 102.

In one embodiment, the PCB 102 slides vertically into a slot 112 of the housing 110 as illustrated by dashed lines in FIG. 1. The PCB 102 may be inserted into the slot 112 of the housing 110 until a notch 114 mates with a respective locking slot 106 to hold the PCB 102 in place. Notably, no adhesives or glue is necessary to couple the PCB 102 to the housing 110, thus, leading to easier and more efficient manufacturing of the SMCB indicator light 100.

The housing 110 also comprises at least one opening 116 along a perimeter of the housing 110. In other words, at least one side of the housing 110 has an opening 116. In addition, the housing 110 includes at least one opening 118 along a bottom of the housing 110. Thus, the PCB 102 may be vertically inserted into the slot 112 via the opening 118. Moreover, the PCB 102 may be placed adjacent to the opening 116. This minimizes the distance between the viewing surface and a light output of the LED 104 on the PCB 102. In addition, the PCB 102 is aligned in the slot 112 such that the LED 104 faces the opening. Accordingly, a light emitted from the LED 104 of the PCB 102 is in the same direction as the opening 116 and may exit through the same opening 116.

The housing 110 is designed to be removable from the PCB 102 for easy access to solder pads (discussed below) for removal or rework on a mother board or a main circuit board (discussed below). As a result, the SMCB indicator light 100 is designed to be easily re-workable with soldering iron front and back access.

Moreover, the design of the SMCB indicator light 100 allows the source of light to be as close as possible to the viewing surface. Notably, unlike the prism technology discussed above, there is no light loss because as the LED 104 is moved vertically upward or downward in a y direction with respect to the main circuit board, the distance between the light source and the viewing surface is minimized and remains constant. In addition, no reflectors are needed to bend or re-direct the light. This is illustrated by example and discussed below with reference to FIGS. 9 and 10.

Referring back to FIG. 1, an alignment pin 120 may be coupled to the housing 110. In one embodiment, multiple alignment pins 120 may be used. The alignment pin 120 may be a metal or a plastic material. The alignment pin 120 is designed to provide stability for the SMCB indicator light 100 when soldered onto or inserted into a mother board or a main circuit board, as discussed below. For example, a single metallic alignment pin 120 may be used to solder the alignment pin to the main circuit board (e.g., FIG. 9 discussed below). Alternatively, one or more plastic alignment pins 120 may be used and inserted into holes on the main circuit board (e.g., FIG. 10 discussed below).

Figure 3:
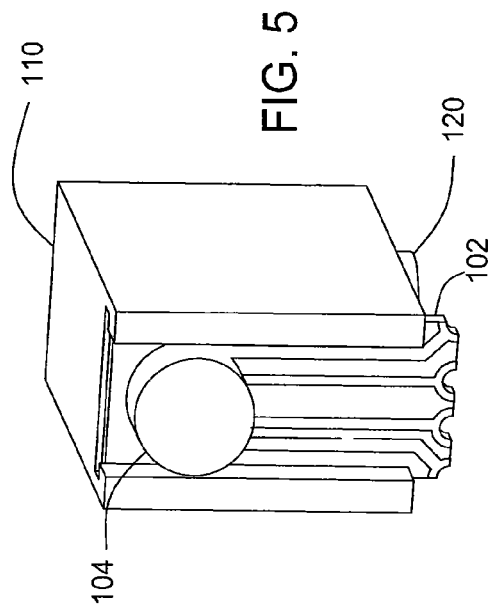
FIG. 3 depicts an illustrative side view of the fully assembled surface mount circuit board indicator.
Figure 5:
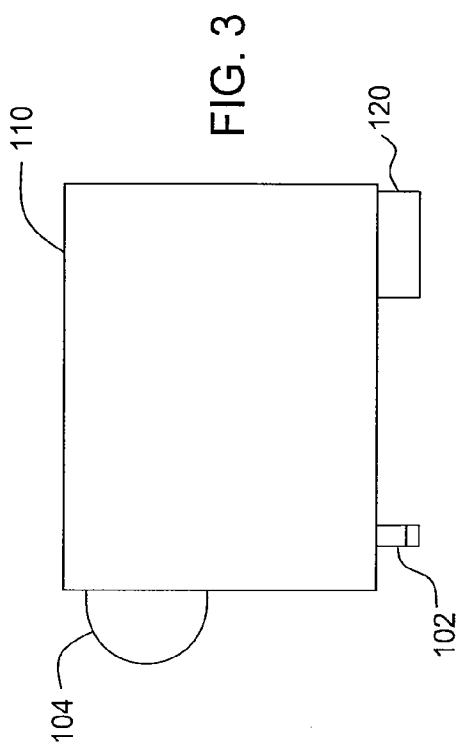
FIG. 5 depicts an illustrative isometric view of the fully assembled surface mount circuit board indicator.
Figure 2:
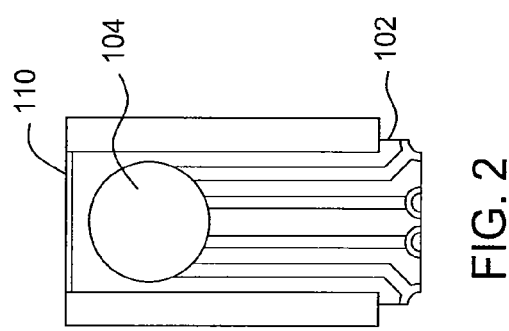
FIG. 2 depicts an illustrative front view of a fully assembled surface mount circuit board indicator.
Figure 4:
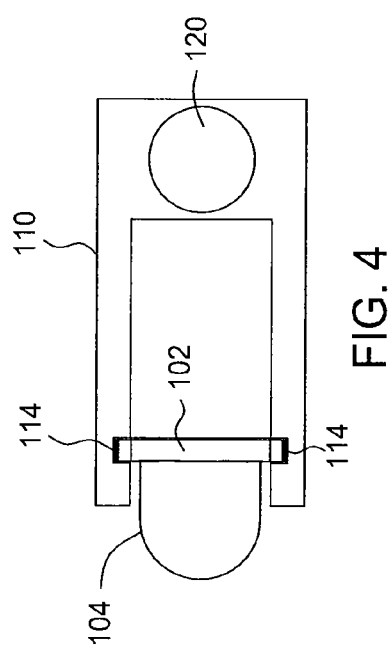
FIG. 4 depicts an illustrative bottom view of the fully assembled surface mount circuit board indicator.

FIGS. 2, 3, 4 and 5 depict various illustrative views of a fully assembled SMCB indicator light 100. FIG. 2 depicts an illustrative front view of the fully assembled SMCB indicator light 100. FIG. 3 depicts an illustrative side view of the fully assembled SMCB indicator light 100. FIG. 4 depicts an illustrative bottom view of the fully assembled SMCB indicator light 100. FIG. 5 depicts an illustrative isometric view of the fully assembled SMCB indicator light 100.

FIG. 6 illustrates a more detailed view of the PCB 102. In one embodiment, the LED 104 comprises at least one lens 202, at least one LED die or chip 204 and one or more wire bonds 206. The lens 202 covers one or more LED dice 204 on the PCB 102. Although only a single lens 202 and a single LED die 204 is illustrated in FIG. 6, it should be noted that the PCB 102 may include any number of lenses 202 and LED dice 204, as discussed below.

In one embodiment, the lens 202 may comprise an epoxy lens or a silicone lens. The lens 202 may comprise a variety of shapes including, for example, a dome shape, a square shape, a circular shape and the like to supply a variety of viewing angles. In one embodiment, the lens 202 may include diffusion and/or texturing on the surface of the lens 202 to achieve various lighting effects and viewing angles. The lens 202 may be a variety of sizes. For example, the lens 202 may be 2 millimeters (mm) in diameter to 3 mm in diameter. However, it should be noted that the size of the lens 202 may be determined by a size needed for a particular application. In other words, the lens 202 may be manufactured to simply cover and protect the LED die 204 and the one or more wire bonds 206 or be more complex to incorporate various optical features.

In one embodiment, the PCB 102 includes one or more traces or vias 218. The one or more traces 218 are conductive. Each one of the traces 218 is coupled to a respective pad location 108. The number of traces 218 on the PCB 102 is determined by the number of LED dice 204. Moreover, the traces 218 may be located on a front side or a back side of the PCB 102, as will be discussed below. In addition, depending on the thickness of the PCB 102, the traces 218 may also be located on layers located between the front side and the back side of the PCB 102.

The traces 218 provide the ability to individually address or independently control each one of the LED dice 204 and/or each one of the LEDs 104 on the PCB 102 by a processor or controller (not shown). For example, FIG. 7 illustrates the PCB 102 having three LED dice $204_1$, $204_2$ and $204_3$ (also referred to collectively as LED dice 204). Each one of the LED dice 204 in FIG. 7 may be a different color or all of the same color. In the embodiment illustrated in FIG. 7, a wire bond 206 is coupled to each one of the LED dice 204. In addition, a respective trace $218_1$, $218_2$ and $218_3$ is coupled to each one of the LED dice $204_1$, $204_2$ and $204_3$. In addition, a common trace $218_4$ is coupled to all three LED dice $204_1$-$204_3$. Each one of the traces $218_1$, $218_2$, $218_3$ and $218_4$ is also coupled to a respective pad location $108_1$, $108_2$, $108_3$ and $108_4$.

As a result, each one of the LED dice 204 may be individually addressed or independently controlled. Moreover, if the PCB 102 comprises multiple LEDs 104 (as discussed below), each one of the LED dice 204 within the additional LEDs 104 may also be independently controlled.

Referring back to FIG. 6, the PCB 102 includes a vertical extension member 210. In one embodiment, the vertical extension member 210 may be created by positioning the LED 104 (including the LED die 204 and the lens 202) off center on the PCB 102. For example, the LED 104 may be intentionally positioned closest to one edge of the PCB 102. This allows LED 104 to be placed a greater vertical distance in the y-direction above or below the main circuit board that the SMCB indicator light 100 is mounted on.

Line 212 represents the vertical distance in the y-direction above or below the main circuit board. The line 212 is a function of a vertical length of the vertical extension member 210. In one embodiment, line 212 is measured from a center of the LED 104 to an edge of the PCB 102 coupled to a main circuit board. The distance of line 212 may vary depending on the requirements of a particular application. In one embodiment, a length of the line 212 may be greater than or equal to 0.060 inches (in). In one embodiment, the length of the line 212 may be greater than or equal to 0.079 in. In one embodiment, the length of the line 212 may be greater than or equal to 0.125 in. In one embodiment, the length of the line 212 may be greater than or equal to 0.200 in. As a result, the light emitted from the LED 104 via the LED die 204 maintains a minimum distance from the viewing surface of the lens 202 even as the distance of line 212 and the length of the vertical extension member 210 increase.

Furthermore, the vertical extension member 210 allows the LED 104 to not contact the main circuit board. This allows greater flexibility in using different sized lenses and different shaped lenses on the PCB 102. In other words, the lens 202 in the present invention is not relied upon to support and mount the LED on the main circuit board. Rather, the housing 110 and the alignment pin 120 of the SMCB indicator light 100 provide mechanical stability on the main circuit board. This allows many more lens designs to be considered for use on the PCB 102 than other used technologies.

Figure 8:
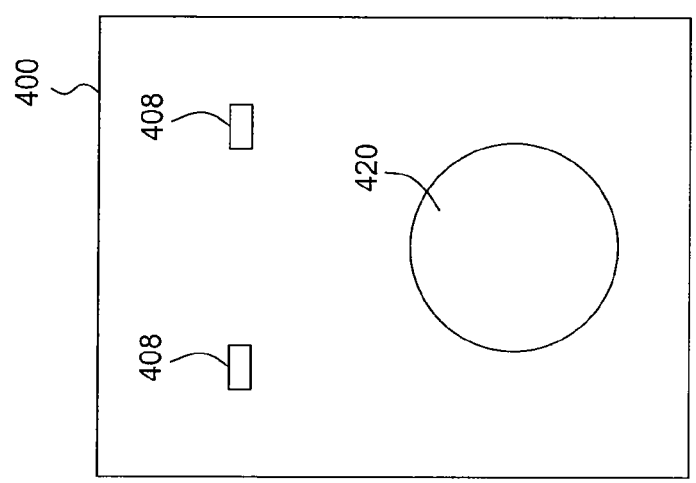
FIG. 8 depicts a main circuit board and an illustrative pad layout for receiving the surface mount circuit board indicator.

As discussed above, the SMCB indicator light 100 may be mounted onto a mother board or a main circuit board. FIG. 8 depicts an illustrative mother board or main circuit board 400. The main circuit board 400 may include at least one conductive solder pad 408 and at least one alignment solder pad 420 for receiving a corresponding pad location 108 of the PCB 102 and a corresponding alignment pin 120 of the housing 110. The size of the at least one conductive solder pad 408 may vary depending on a thickness of the PCB 102 and the corresponding pad location 108. Also, the at least one alignment solder pad 420 may be non-conductive and generally used for mechanical purposes.

In one embodiment, the SMCB indicator light 100 may be mounted onto the main circuit board 400 by aligning each one of the pad locations 108 with a respective conductive solder pad 408 and the alignment pin 120 with a respective alignment solder pad 420. A solder paste may be applied to the conductive solder pad 408 and the alignment solder pad 420 for soldering the SMCB indicator light 100 to the main circuit board 400.

The number of conductive solder pads 408 and the alignment solder pads 420 directly correspond to the number of pad locations 108 on the PCB 102 and the number of alignment pins 120 used in the housing 110. In addition, those skilled in the art will recognize that the main circuit board 400 may include additional components or devices that are not shown.

Figure 9:
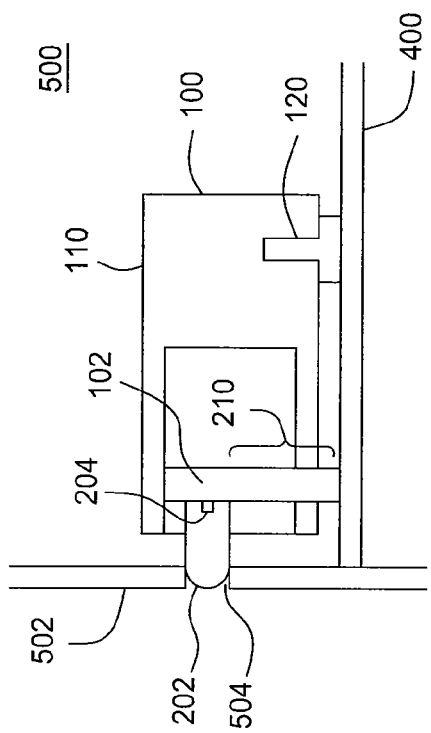
FIG. 9 depicts an illustrative side view of the surface mount circuit board indicator mounted on the main circuit board for a right angle indication application using one or more alignment pins soldered to the main circuit board.

As noted above, the fully assembled SMCB indicator light 100 may be mounted onto a main circuit board for right angle indication applications. FIG. 9 illustrates a side view of an application 500 using the SMCB indicator light 100. FIG. 9 illustrates the SMCB indicator light 100 mounted onto the main circuit board 400, as described above. The SMCB indicator light 100 is aligned with an opening 504 of a panel 502 of the application 500. Although in one embodiment, the lens 202 appears to be in the opening 504 of the panel 502, it should be noted that the lens 202 may extend through the opening 504 or be positioned some distance behind the opening 504. In addition, the LED die 204 is positioned 90 degrees or perpendicularly relative to a surface of the main circuit board 400.

As noted above, the design of the SMCB indicator light 100 allows the source of light to be as close as possible to the viewing surface. Notably, unlike the prism technology discussed above, there is no light loss because the distance between the light source (e.g. the LED die 204) and the viewing surface (e.g. the lens 202) is minimized and no reflectors are needed to bend or re-direct the light as a required distance y above or below the main circuit board increases.

As illustrated by FIG. 9, a distance between a viewing surface of the lens 202 and the LED die 204 is minimal. Moreover, the LED die 204 is proximate to and a light output surface of the LED die 204 faces an opening in the housing 110 and the opening 504 of the panel 502. In other words, the LED die 204 emits a light in the same direction as the opening in the housing 110 and the opening 504 of the panel 502. Notably, the minimal distance between the viewing surface of the lens 202 and the LED die 204 will remain constant even if the opening 504 is raised vertically above or lowered vertically below the main circuit board 400. In other words, the vertical extension member 210 of the PCB 102 simply needs to be elongated to accommodate any increase in vertical height of the opening 504 without losing any light output. In contrast, using previous technologies, as the vertical height of the opening 504 increases, greater loss of light output would occur due to the fact that the distance between the viewing surface of the lens and the light source would increase.

In one embodiment, the panel 502 may comprise multiple openings 504. Consequently, an SMCB indicator light having a plurality of LEDs may be used as discussed below. For example, if the panel 502 includes four vertically aligned openings 504, a SMCB indicator light having a vertically aligned array of four LEDs may be used, as illustrated below. In such case, each one of the LED dice of each one of the LEDs would still maintain a minimum distance from a viewing surface of a respective lens. Thus, even in an SMCB indicator light having a multiple LED array, light loss is minimized. This may also be true for multiple horizontally aligned openings 504 of the panel 502 that require each of the horizontally aligned LEDs on the PCB 102 to be at some vertical height above or below the main circuit board 400.

Figure 10:
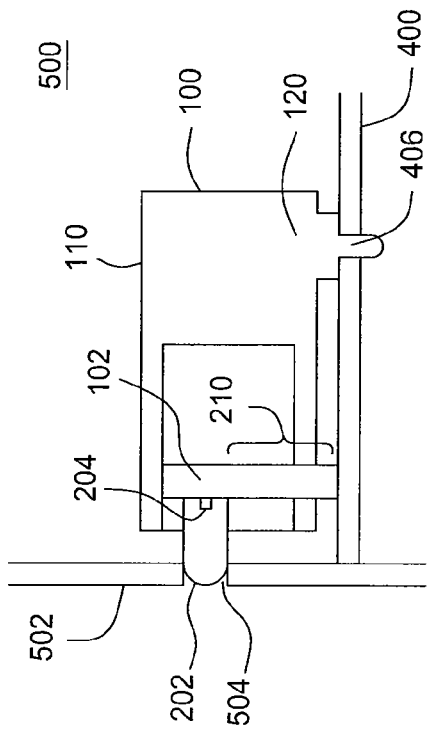
FIG. 10 depicts an illustrative side view of the surface mount circuit board indicator mounted on the main circuit board for a right angle indication using one or more alignment pins placed through the main circuit board.

FIG. 10 depicts an example of an SMCB indicator light 100 mounted on the main circuit board 400 via one or more plastic alignment pins 120 inserted into corresponding holes 406 on the main circuit board 400. In one embodiment, the one or more plastic alignment pins 120 may be molded as part of the housing 110. FIG. 10 is similar to FIG. 9 in all other respects.

Consequently, the present invention provides a more efficient lighting apparatus for right angle indication applications. Unlike previous technologies that require a larger LED to make up for loss of light output, the present invention allows a smaller LED to be used, thus providing a smaller footprint, by maintaining a minimum distance between the viewing surface of the lens 202 and the LED die 204 irrespective of a vertical distance above or below the main circuit board 400. As a result, the SMCB indicator light 100 provides a more efficient light source using less energy and generating less heat.

As noted above, the SMCB indicator light 100 may include an array of vertically aligned LEDs 104. FIG. 11 depicts an illustrative front view of a PCB 602 having four LEDs $604_1$-$604_4$ (also referred to herein collectively as LEDs 604).

Although only four LEDs are illustrated, those skilled in the art will recognize that the example illustrated in FIGS. 11-13 may apply to a SMCB indicator light having any number of LEDs and LED dice, such as for example, two LEDs in a bi-level, three LEDs in a tri-level, five LEDs in a quint-level and so on.

Similar to the LEDs 104 of the PCB 102, the LEDs 604 also comprise at least one LED die, at least one wire bond and a lens covering the at least one LED die and the at least one wire bond. However, some details are not illustrated in FIGS. 11-13 for clarity. In one embodiment, each one of the LEDs $604_1$-$604_4$ is coupled to a respective trace $618_1$-$618_4$ (also referred to herein collectively as traces 618). The PCB 602 also includes a common trace $618_5$ connected to all of the LEDs 604. Furthermore, each one of the traces $618_1$-$618_5$ is coupled to a respective pad location $608_1$-$608_5$ (also referred to herein collectively as pad locations 608).

FIG. 11 illustrates a front side 620 having traces $618_1$, $618_4$ and $618_5$. However, to maintain a small footprint and to prevent from drastically increasing the size of the PCB 602 as the number of LEDs 604 and/or LED dice increases, a back side 622 may be used to add additional traces 618 as illustrated by FIG. 12. For example, traces $618_2$ and $618_3$ are located on the back side 622 of the PCB 602. Moreover, as more traces are used, the traces may be also located on layers between the front side 620 and the back side 622 of the PCB 602. When using multiple layers, insulation may be used between each layer of the PCB 602 for proper pad spacing.

In one embodiment, the number of traces 618 is dependent upon the number of LED dies (not shown) on the PCB 602. For example, one or more of the LEDs 604 may include a plurality of LED dice, similar to the LED 104 illustrated in FIG. 7 above. Thus, each one of the LED dice would be coupled to a respective trace 618. For example, if each one of the four LEDs $604_1$-$604_4$ illustrated in FIG. 11 included three different colored LED dice, then eight additional traces would be required. Thus, utilizing the back side 622 and layers between the front side 620 and the back side 622 of the PCB 602 helps to prevent the footprint of the PCB 602 from drastically increasing as the number of traces increases.

FIG. 13 depicts an illustrative isometric view of a fully assembled SMCB indicator light 600 having a plurality of LEDs 604 vertically aligned. Similar to the SMCB indicator light 100, the SMCB indicator light 600 comprises the PCB 602 vertically inserted into a housing 610 and at least one alignment pin 620 coupled to the housing 610. Other than for the number of LEDs 604 and the size of the housing 610 to accommodate the number of LEDs 604, the SMCB indicator light 600 is similar to SMCB indicator light 100 in all other respects.

Although, FIGS. 11-13 illustrate a plurality of LEDs vertically aligned on a PCB, it should be noted that a plurality of LEDs may also be horizontally aligned. Accordingly, a housing fabricated to accommodate the PCB with horizontally aligned LEDs may be coupled to the PCB and one or more alignment pins may be coupled to the housing.

In a further embodiment, the housing 610 can be made with an add-on extension 612, illustrated by dashed lines in FIG. 13, to tunnel light from the LEDs 604 of the PCB 602 to a front panel or faceplate (e.g. panel 502 of FIGS. 9 and 10) to minimize light bleed on multiple LED arrays. The housing extensions used to tunnel light as close as possible to the front panel also can be used for light pipe attachments and retention when the front panel is far away from the PCB 602.

Another advantage of the present invention is the ease of assembly and manufacturability of the SMCB indicator lights disclosed herein. For example, in an exemplary embodiment, no adhesives are required. Furthermore, the design of the SMCB indicator light may be designed to be used with pick and placeable standard equipment. In addition, the PCB of the SMCB indicator light may be manufactured in arrays and split into a single PCB or a multiple arrays of PCBs as necessary.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A surface mount circuit board indicator, comprising:
a printed circuit board (PCB) having at least one light emitting diode (LED) die, one or more traces, at least one lens and one or more pad locations used for electrical contacts along an edge of the PCB where the PCB is vertically coupled to another circuit board;
a housing comprising at least one opening on a side along a perimeter of said housing, wherein said PCB is coupled to said housing by vertically inserting said PCB into said housing via a slot in said housing, wherein said PCB is coupled to said housing where a light output surface of said at least one LED die faces a same direction as said at least one opening; and
at least one alignment pin coupled to said housing.

2. The surface mount circuit board indicator of claim 1, wherein said at least one LED die and said at least one lens are positioned off center on said PCB.

3. The surface mount circuit board indicator of claim 2, wherein said at least one LED die and said at least one lens is positioned off center on said PCB to create a vertical extension member having a vertical length of at least 0.060 inches (in) on said PCB.

4. The surface mount circuit board indicator of claim 1, wherein said PCB is coupled to said housing adjacent to said opening of said housing.

5. The surface mount circuit board indicator of claim 1, wherein said PCB comprises a plurality of LED dice and a plurality of lenses.

6. The surface mount circuit board indicator of claim 5, wherein said plurality of LED dice and said plurality of lenses are vertically aligned or horizontally aligned.

7. The surface mount circuit board indicator of claim 5, wherein each one of said plurality of LED dice is independently controllable via a respective trace.

8. The surface mount circuit board indicator of claim 1, wherein said PCB comprises a plurality of LED dice, wherein each one of said plurality of LED dice is a different color.

9. The surface mount circuit board indicator of claim 1, wherein said at least one alignment pin comprises at least one of: a plastic material or a metal material.

10. A printed circuit board (PCB) comprising:
a plurality of lenses, wherein each one of said plurality of lenses covers at least one light emitting diode (LED) die coupled to said PCB;
at least one trace coupled to each one of said at least one LED die;
at least one locking slot;
a vertical extension member, wherein said PCB is vertically inserted into a housing where a light output surface of each one of said at least one LED die faces a same direction as at least one opening on a side along a perimeter of said housing; and one or more pad locations used for electrical contacts along an edge of the PCB where the PCB is vertically coupled to another circuit board.

11. The PCB of claim 10, wherein each one of said plurality of lenses covers a plurality of different colored LED dice.

12. The PCB of claim 10, wherein each one of said at least one LED dice are independently controllable via a respective trace of said at least one trace.

13. The PCB of claim 10, wherein said at least one trace is coupled to at least one of: a front side of said PCB, a back side of said PCB or one or more layers between said front side and said back side of said PCB.

14. The PCB of claim 10, wherein said at least one locking slot mates with a notch in a vertical slot of said housing when said PCB is vertically inserted into said housing.

15. The PCB of claim 14, wherein said PCB is vertically inserted into said housing adjacent to said at least one opening.

16. The PCB of claim 10, wherein said vertical extension member is formed by placing said plurality of lenses off center on said PCB.

17. The PCB of claim 10, wherein said vertical extension member comprises a vertical length of at least 0.060 inches (in).

18. A circuit board for receiving a surface mount circuit board indicator, comprising:
- at least one alignment solder pad for receiving at least one alignment pin of said surface mount circuit board indicator; and
- at least one conductive solder pad for receiving at least one pad location along an edge of a printed circuit board (PCB) coupled to a trace where the PCB is vertically coupled to the circuit board, wherein said trace is coupled to at least one light emitting diode (LED) die of the PCB, wherein said at least one LED die is covered by a respective lens and said PCB is vertically inserted into a housing where said at least one LED die of said PCB emits a light in a same direction as at least one opening on a side along a perimeter of said housing and said light exits through said at least one opening, wherein said PCB is adjacent to said at least one opening.

* * * * *

UNITED STATES PATENT AND TRADEMARK OFFICE
CERTIFICATE OF CORRECTION

PATENT NO.        : 8,593,298 B2
APPLICATION NO.   : 12/435090
DATED             : November 26, 2013
INVENTOR(S)       : Klaus Oesterheld and Kenneth Jenkins It is certified that error appears in the above-identified patent and that said Letters Patent is hereby corrected as shown below:

Title page

Item (56) Other Publications, page 2, line 1, Delete "200680102780.3," and insert
-- 200880102780.3, --, therefor.

Signed and Sealed this
Eighth Day of December, 2015

Michelle K. Lee
*Director of the United States Patent and Trademark Office*